(12) United States Patent
Noma

(10) Patent No.: US 8,188,497 B2
(45) Date of Patent: May 29, 2012

(54) SEMICONDUCTOR DEVICE AND METHOD OF MANUFACTURING THE SAME

(75) Inventor: Takashi Noma, Ota (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 117 days.

(21) Appl. No.: 12/524,521

(22) PCT Filed: Jan. 30, 2008

(86) PCT No.: PCT/JP2008/051898
§ 371 (c)(1),
(2), (4) Date: Jul. 24, 2009

(87) PCT Pub. No.: WO2008/093880
PCT Pub. Date: Aug. 7, 2008

(65) Prior Publication Data
US 2010/0038668 A1 Feb. 18, 2010

(30) Foreign Application Priority Data
Feb. 2, 2007 (JP) .................................. 2007-023878

(51) Int. Cl.
*H01L 33/00* (2010.01)
(52) U.S. Cl. ............ 257/98; 257/99; 257/100; 257/292; 257/E33.001
(58) Field of Classification Search ...................... 257/98, 257/99, 100, 292, E33.001
See application file for complete search history.

(56) References Cited

U.S. PATENT DOCUMENTS

| 4,857,746 A | 8/1989 | Kuhlmann et al. |
| 5,252,852 A | 10/1993 | Makiuchi et al. |

(Continued)

FOREIGN PATENT DOCUMENTS

CA 1061884 9/1979

(Continued)

OTHER PUBLICATIONS

International Search Report mailed on Mar. 11, 2008 directed towards counterpart international application No. PCT/JP2008/051898; 6 pages.

(Continued)

*Primary Examiner* — Tan N Tran
(74) *Attorney, Agent, or Firm* — Morrison & Foerster LLP

(57) ABSTRACT

The invention is directed to providing a smaller semiconductor device with a lower manufacturing cost and higher reliability and a method of manufacturing the same. A light emitting element (a LED die 8) is formed on a first substrate 1. A cathode electrode 10 connected to an N type region of the LED die 8 is formed between the first substrate 1 and the LED die 8. The side surface of the LED die 8 is covered by an insulation layer 11. An anode electrode 12 is formed extending from on the front surface of the first substrate 1 onto a P type region of the LED die 8 along the circumference of the insulation layer 11. Wiring layers 18 electrically connected to the cathode electrode 10 and the anode electrode 12 are formed on the side surface of the first substrate 1 therealong. The wiring layers 18 extend onto the back surface of the first substrate 1. Conductive terminals 22 electrically connected to the wiring layers 18 through electrode connection layers 20 are formed on the back surface of the first substrate 1.

8 Claims, 21 Drawing Sheets

U.S. PATENT DOCUMENTS

| | | | |
|---|---|---|---|
| 5,357,121 | A | 10/1994 | Miyashita et al. |
| 7,015,055 | B2 * | 3/2006 | Oohata et al. ............ 438/22 |
| 7,365,364 | B2 | 4/2008 | Huang et al. |
| 7,468,551 | B2 | 12/2008 | Lin et al. |
| 7,576,402 | B2 | 8/2009 | Noma |
| 7,582,944 | B2 | 9/2009 | Fukuda et al. |
| 7,638,813 | B2 | 12/2009 | Kinsman |
| 2001/0042858 | A1 * | 11/2001 | Ishinaga ............ 257/13 |
| 2006/0180818 | A1 * | 8/2006 | Nagai et al. ............ 257/89 |
| 2006/0289982 | A1 * | 12/2006 | Miura ............ 257/690 |
| 2010/0096659 | A1 | 4/2010 | Noma |

FOREIGN PATENT DOCUMENTS

| | | |
|---|---|---|
| DE | 26 50 770 | 5/1977 |
| DE | 3633181 | 4/1988 |
| JP | 52-057789 | 5/1977 |
| JP | 53-028387 | 3/1978 |
| JP | 09-283803 | 10/1987 |
| JP | 63-102379 | 5/1988 |
| JP | 64-023584 | 1/1989 |
| JP | 03-191572 | 8/1991 |
| JP | 07-263754 | 10/1995 |
| JP | 11-307878 | 11/1999 |
| JP | 2000-315062 | 11/2000 |
| JP | 2001-077406 | 3/2001 |
| JP | 2003-318447 | 11/2003 |
| JP | 2003-347583 | 12/2003 |
| JP | 2006-173197 * | 6/2006 |
| NL | 7612271 | 5/1977 |

OTHER PUBLICATIONS

International Search Report mailed Mar. 4, 2008, directed to PCT/JP2008/051884; 6 pages.

* cited by examiner

US 8,188,497 B2

SEMICONDUCTOR DEVICE AND METHOD OF MANUFACTURING THE SAME

REFERENCE TO RELATED APPLICATIONS

This application is a national stage application under 35 USC 371 of International Application No. PCT/JP2008/051898, filed Jan. 30, 2008, which claims priority from Japanese Patent Application No. 2007-023878, filed Feb. 2, 2007, the contents of which are incorporated herein by reference.

BACKGROUND OF THE INVENTION

1. Field of the Invention

The invention relates to a semiconductor device having a light emitting element and a method of manufacturing the same.

2. Description of the Related Art

A light emitting diode (LED: Light Emitting Diode) can generate light stably for a long time with relatively low electric power, and is generally used as a light emitting element. A conventional semiconductor device having a light emitting element will be described referring to FIGS. 25 and 26.

As shown in FIG. 25, a conventional semiconductor device 100 has a first lead 101 (a cathode), a light emitting element (a LED die 102) having a front surface electrode and a back surface electrode and disposed on the first lead 101, and a second lead 104 (an anode) electrically connected to the front surface electrode of the LED die 102 through a bonding wire 103. The portion of the first lead 101 on which the LED die 102 is disposed is formed into a concave shape. This concave portion 105 is plated with silver, for example. Therefore, the concave portion 105 functions as a light reflection surface, by which an attempt is made to enhance the luminance of light emitted from the LED die 102. Furthermore, the components described above are sealed with transparent resin 106.

The lighting on and off of this semiconductor device 100 are controlled by supplying a given voltage from other driver device (not shown) than the semiconductor device 100 to the first lead 101 and the second lead 104.

A conventional photocoupler (Photo coupler) will be described as a semiconductor device having a light emitting element. The photocoupler is a semiconductor device having a light emitting element and a light receiving element, and realizes signal transmission by converting an inputted electric signal into light by the light emitting element and making the light receiving element conductive with the light.

As shown in FIG. 26, a conventional photocoupler 110 has an LED die 111 as a light emitting element and a PD (Photo Diode) die 112 as a light receiving element. The LED die 111 and the PD die 112 are disposed so as to face each other, and electrically connected to leads 114 through bonding wires 113. The LED die 111 and the PD die 112 are sealed with transparent resin 115, and further sealed with mold resin 116 that blocks light. The LED die 111 and the PD die 112 are not electrically connected. In this photocoupler 110, signal transmission is achieved by converting an inputted electric signal into a light signal at the LED die 111 and making the PD die 112 conductive with this light.

Relevant technologies to the invention are described in Japanese Patent Application Publication Nos. 2003-318447 and 2003-347583, for example.

In the conventional semiconductor device 100 (FIG. 25) described above, it is difficult to make the first lead 101 having the concave portion 105, the bonding wire 103, the second lead 104 and so on finer, and all of these need be sealed with the transparent resin 106. Therefore, there is a problem of difficulty in making the whole size smaller. Furthermore, since it is necessary to perform an assembling work (e.g. a process of disposing the LED die 102 on the first lead 101, a process of connecting the LED die 102 to the second lead 104 using the bonding wire 103, a process of sealing the whole with the transparent resin 106 and so on) after each of the components is completed separately, there is a problem of complex manufacturing processes and an increased cost.

On the other hand, in the photocoupler 110 (FIG. 26) described above, since it is necessary to dispose the LED die 111 and the PD die 112 on the leads 114 so that these face each other, form the bonding wires 113 connected to the LED die 111 and the PD die 112, respectively, and further seal all of these with the transparent resin 115 and the mold resin 116, it is also difficult to make the whole size smaller. Furthermore, like the semiconductor device 100, it is necessary to perform an assembling work (a process of disposing the LED die 111 and the PD die 112 on the leads 114 so that these face each other, a process of connecting the dies to the leads 114 using the bonding wires 113, respectively, a process of filling the space between the LED die 111 and the PD die 112 with the transparent resin 115, and so on), there is a problem of complex manufacturing processes and an increased cost.

As described above, a conventional semiconductor device having a light emitting element has a problem of impossibility in making the whole device smaller and thinner and an increased manufacturing cost.

SUMMARY OF THE INVENTION

Therefore, the invention is directed to providing a smaller semiconductor device with a low manufacturing cost and high reliability and a method of manufacturing the same.

The invention is to address the problem mentioned above and the main features are as follows. In detail, a semiconductor device of the invention includes: a first substrate having a front surface and a back surface; a light emitting element having a first conductive region and a second conductive region and formed on the front surface of said first substrate, said first conductive region facing the front surface; an insulation layer covering a side surface of said light emitting element; a first electrode formed on the front surface of said first substrate and electrically connected to said first conductive region; a second electrode extending from on the front surface of said first substrate onto the second conductive region of said light emitting element along said insulation layer; and a wiring layer electrically connected to said first or second electrode and formed along a side surface of said first substrate.

Furthermore, a semiconductor device of the invention includes: a first substrate having a front surface and a back surface; a light emitting element having a first conductive region and a second conductive region and formed on the front surface of said first substrate, said first conductive region facing the front surface; an insulation layer covering a side surface of said light emitting element; a first electrode formed on the front surface of said first substrate and electrically connected to said first conductive region; a second electrode extending from on the front surface of said first substrate onto the second conductive region of said light emitting element along said insulation layer; and a conductive terminal electrically connected to said first or second electrode and protruding in a thickness direction of said first substrate.

The feature of a method of manufacturing a semiconductor device of the invention is as follows. The method includes: forming a conductive layer as a first electrode on a front surface of a first substrate having the front surface and a back surface; forming a plurality of light emitting elements on a front surface of a first supporting body, each of the light emitting elements having a first conductive region and a second conductive region; attaching said first substrate and said first supporting body so as to connect said first conductive region and said conductive layer, and then removing the first supporting body to transfer said light emitting elements to said first substrate; forming an insulation layer covering a side surface of said light emitting element; forming a second electrode extending from on the front surface of said first substrate onto the second conductive region of said light emitting element along said insulation layer; attaching a second supporting body to the front surface of the first substrate; and cutting said first substrate along a predetermined line into individual dies.

Furthermore, a method of manufacturing a semiconductor device of the invention includes: forming a conductive layer as a first electrode on a front surface of a first substrate having the front surface and a back surface; forming a plurality of light emitting elements on a front surface of a first supporting body, each of the light emitting elements having a first conductive region and a second conductive region; picking up said light emitting element from said first supporting body, and disposing said light emitting element on the front surface of said first substrate so as to connect said first conductive region and said conductive layer; forming an insulation layer covering a side surface of said light emitting element; forming a second electrode extending from on the front surface of said first substrate onto the second conductive region of said light emitting element along said insulation layer; and cutting said first substrate along a predetermined line into individual dies.

Different from the conventional structure, in the structure of the invention the dies are united from in the wafer state. Furthermore, since the components of the semiconductor device are formed by a wafer process, the formation of finer components is achieved. This realizes a thinner and smaller semiconductor device.

Furthermore, the semiconductor device is completed as a die at the time of separation into individual semiconductor devices in the invention, different from the conventional where a plurality of components is manufactured separately and a semiconductor device is completed through a subsequent assembling work. This omits processes such as a subsequent assembling work to decrease the manufacturing cost, and achieves enhancement in the workability and productivity of a semiconductor device having a light emitting element.

DETAILED DESCRIPTION OF THE INVENTION

A first embodiment of the invention will be described referring to figures. FIGS. 1 to 14 are cross-sectional views in manufacturing process order.

Figure 1:
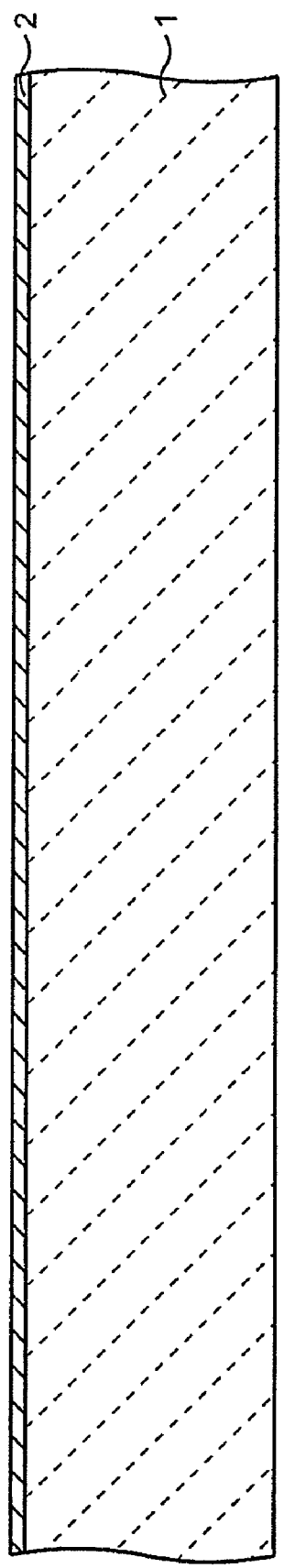
FIG. 1 is a cross-sectional view for explaining a semiconductor device and a method of manufacturing the same of a first embodiment of the invention.

First, as shown in FIG. 1, a conductive layer 2 made of aluminum (Al), copper (Cu) or the like is formed on a front surface of a first substrate 1 to have a thickness of, for example, 1 μm by a deposition method such as a sputtering method or the like. The conductive layer 2 is a layer that is to be patterned into cathode electrodes 10 as described below. The first substrate 1 may be a semiconductor substrate made of silicon (Si) or the like, or may be an insulating substrate made of glass or the like.

Figure 2:
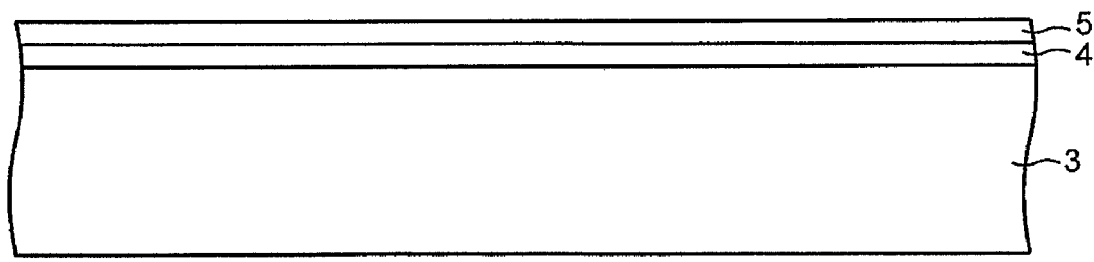
FIG. 2 is a cross-sectional view for explaining the semiconductor device and the method of manufacturing the same of the first embodiment of the invention.

Then, as shown in FIG. 2, an N type second substrate 3 made of, for example, gallium arsenide (GaAs), gallium nitride (GaN) or the like is provided. The thickness of the second substrate 3 is about 300 to 700 μm, for example. The material of the second substrate 3 may be appropriately changed according to a target color of emission light. An N type semiconductor layer 4 and a P type semiconductor layer 5 are then sequentially formed on the front surface of the second substrate 3 by an epitaxial crystal growth method that is generally known. A PN junction region made by these is to be a light emitting region. N type impurities added to the second substrate 3 and the N type semiconductor layer 4 are sulfur (S), selenium (Se), tellurium (Te) or the like, for example. P type impurities added to the P type semiconductor layer 5 are zinc (Zn), for example.

Figure 3:
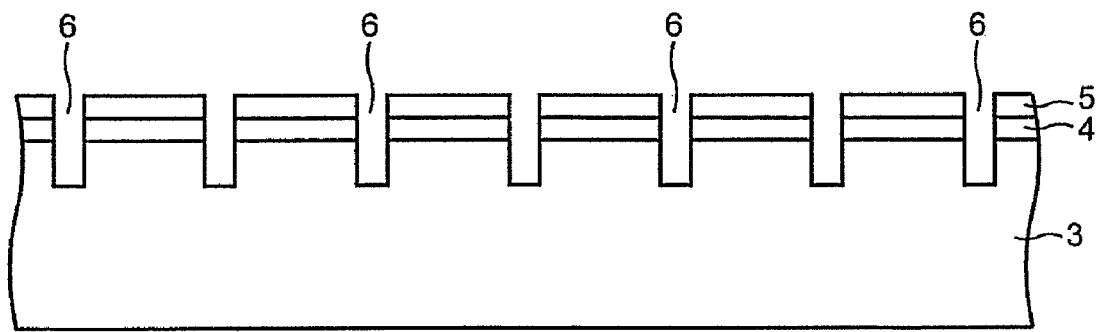
FIG. 3 is a cross-sectional view for explaining the semiconductor device and the method of manufacturing the same of the first embodiment of the invention.

Then, as shown in FIG. 3, the front surface of the second substrate 3 is partially removed to form groove portions 6 reaching the middle of the thickness of the second substrate 3. The depths of the groove portions 6 are 50 μm, for example. The groove portions 6 are formed by so-called half-etching. In detail, for example, the groove portions 6 may be formed by dry-etching using a resist layer (not shown) as a mask. Alternatively, the groove portions 6 may be formed by partially removing the second substrate 3 using a dicing blade or by laser irradiation mechanically.

Figure 4:
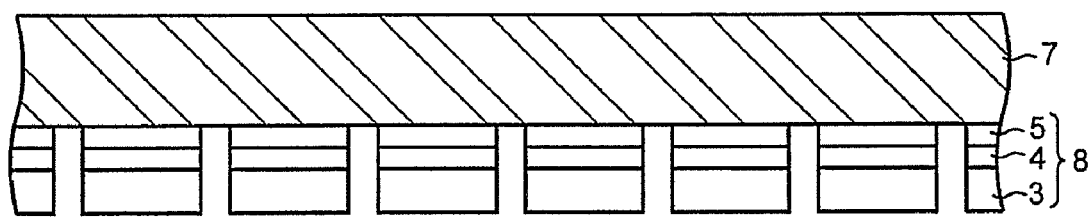
FIG. 4 is a cross-sectional view for explaining the semiconductor device and the method of manufacturing the same of the first embodiment of the invention.

Then, as shown in FIG. 4, a UV tape 7 as a first supporting body, for example, is attached to the front surface of the second substrate 3. Here, the UV tape is a tape having high adhesion and a property such that the adhesion decreases when the tape is irradiated with ultraviolet rays (Ultraviolet rays). Instead of a tape-shaped material such as the UV tape 7, a substrate-shaped material made of glass or the like may be used as the supporting body.

Then, the back surface of the second substrate 3 is ground so as to reach at least the groove portions 6 using a back surface grinder (a grinder). By this, the wafer-shaped second substrate 3 is divided into individual dies (the LED dies 8). In this embodiment, the LED die 8 is a light emitting element of the invention.

The method of forming the groove portions 6 and then dividing the substrate into individual dies by back surface grinding in this manner is called a dicing before grinding (DBG: Dicing Before Grinding) method, and this is preferable for obtaining thinner dies. Instead of using the dicing before grinding method, the LED dies 8 may be formed by a general dicing process. Since the LED dies 8 are attached by the UV tape 7, these do not scatter at this time.

Figure 5:
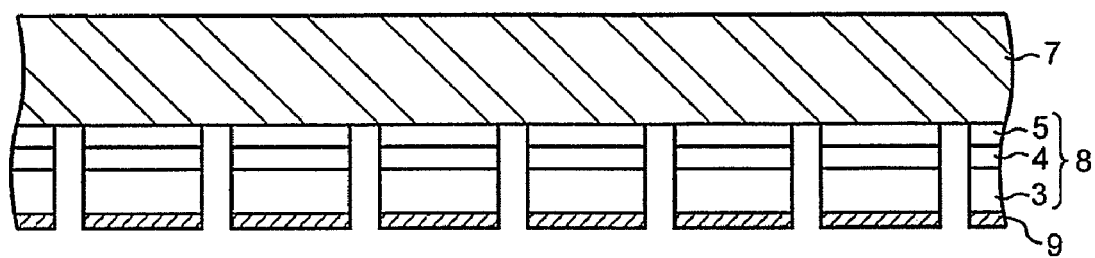
FIG. 5 is a cross-sectional view for explaining the semiconductor device and the method of manufacturing the same of the first embodiment of the invention.

Then, as shown in FIG. 5, a conductive paste 9 is applied to the back surfaces of the LED dies 8. The conductive paste 9 is made by mixing a conductive material such as silver (Ag) or the like and an adhesive material such as epoxy resin or the like, for example, electrically connects the back surfaces (the N type regions) of the LED dies 8 to the conductive layer 2, and functions as an adhesive for attaching the LED dies 8 to the first substrate 1. The conductive paste 9 may be formed on the front surface of the first substrate 1 instead of on the back surfaces of the LED dies 8.

Figure 6:
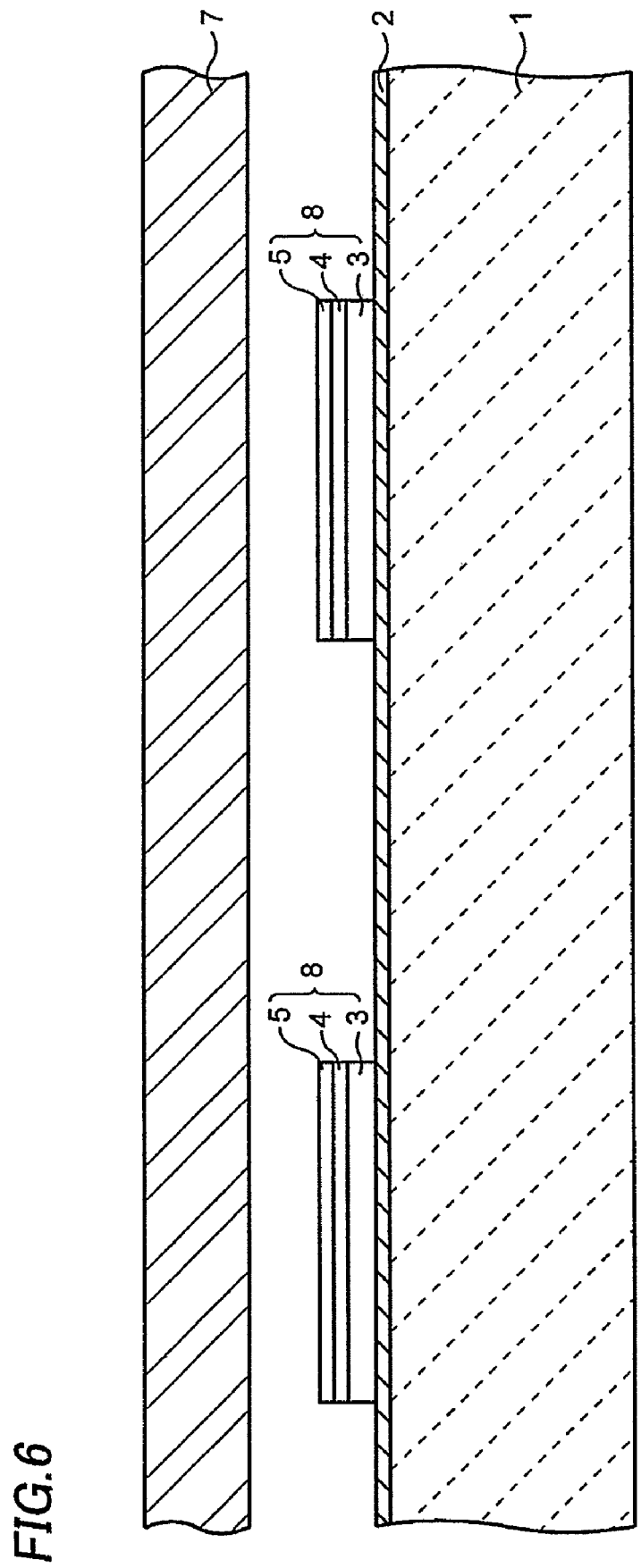
FIG. 6 is a cross-sectional view for explaining the semiconductor device and the method of manufacturing the same of the first embodiment of the invention.

Then, as shown in FIG. 6, the N type regions of the LED dies 8 are attached to the conductive layer 2 with the conductive paste 9 being interposed therebetween so as to be connected thereto, and then irradiated with ultraviolet rays to remove the UV tape 7 from the LED dies 8. The LED dies 8 are thus transferred to the front surface of the first substrate 1 at a time. In FIG. 6 and the following figures, the illustration of the conductive paste 9 is omitted for convenience.

Although the LED dies 8 are transferred to the first substrate after the process of attaching the UV tape 7 to which the LED dies 8 are fixed to the first substrate 1 in the above description, the following process may be employed instead. In detail, the LED dies 8 may be picked up from the UV tape 7 to which the LED dies 8 are fixed, and the LED dies 8 may be individually mounted (transferred) on the front surface of the first substrate 1.

Figure 7:
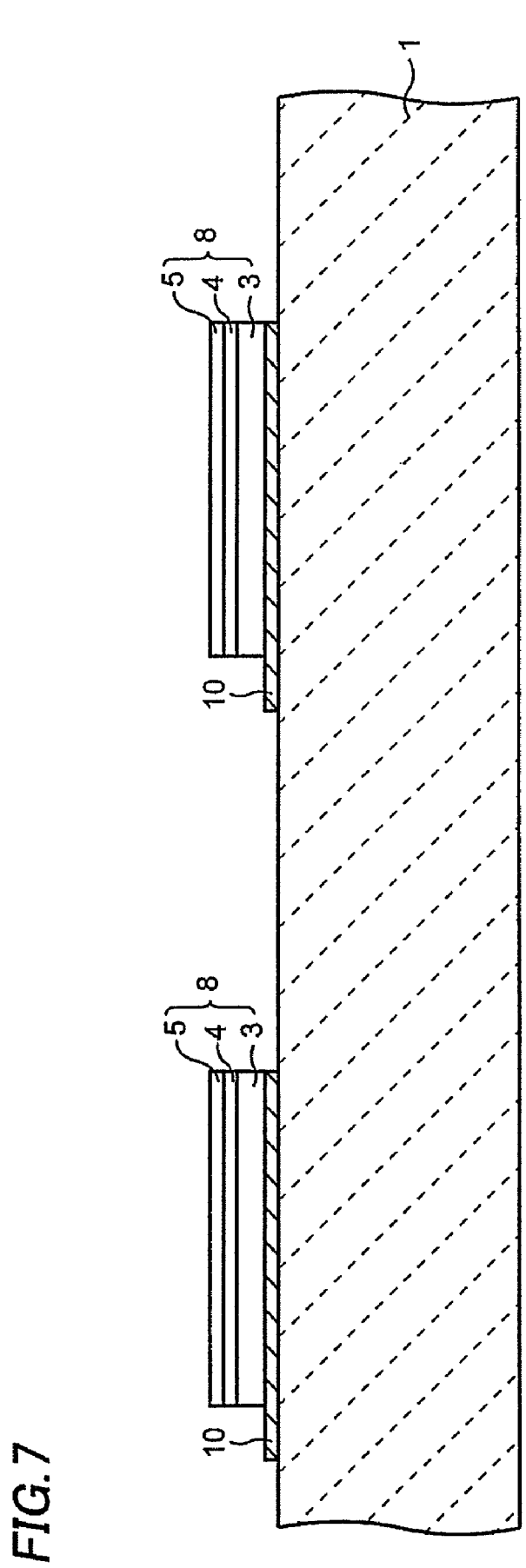
FIG. 7 is a cross-sectional view for explaining the semiconductor device and the method of manufacturing the same of the first embodiment of the invention.

Then, as shown in FIG. 7, an unnecessary portion of the conductive layer 2 is selectively etched and removed using a resist layer (not shown) as a mask. The conductive layer 2 thus forms the cathode electrodes 10 of the LED dies 8. Although the conductive layer 2 is patterned to form the cathode electrodes 10 after the LED dies 8 are transferred to the first substrate 1 in the embodiment, the conductive layer 2 may be patterned before the LED dies 8 are transferred thereto instead.

Figure 8:
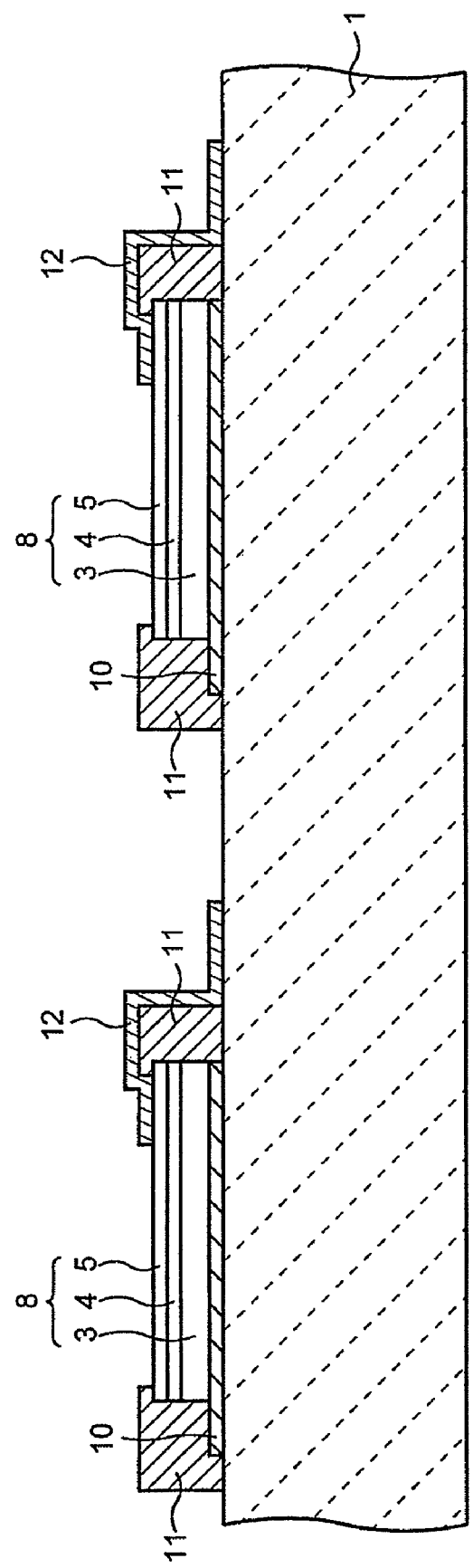
FIG. 8 is a cross-sectional view for explaining the semiconductor device and the method of manufacturing the same of the first embodiment of the invention.

Then, as shown in FIG. 8, insulation layers 11 are formed so as to have openings on parts of the P type regions (the P type semiconductor layers 5) of the LED dies 8 and cover the side surfaces of the LED dies 8 and parts of the cathode electrodes 10. The formation of the insulation layers 11 is performed in the following manner, for example. First, an organic type material such as polyimide type resin, solder resist or the like is applied to the whole surface by an applying and coating method, and then a heat treatment (pre-baking) is performed thereto. Exposure and development are performed to the applied organic type material to form the openings exposing the P type semiconductor layers 5, and then a heat treatment (post-baking) is performed thereto.

Then, a conductive layer made of aluminum, copper or the like is formed on the whole surface by a deposition method such as a sputtering method or the like so as to have a thickness of, for example, 1 μm, and then the conductive layer is selectively etched. Anode electrodes 12 are thus formed extending from on the front surface of the first substrate 1 onto the front surfaces of the P type semiconductor layers 5 along the circumferences of the insulation layers 11.

Figure 9:
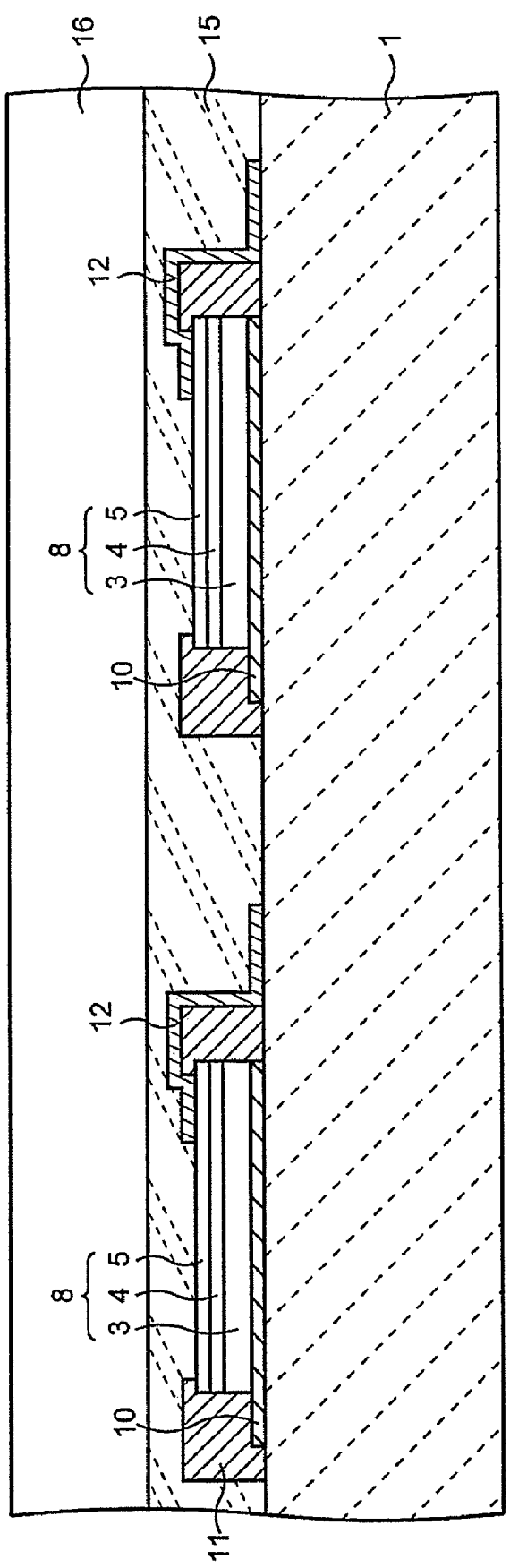
FIG. 9 is a cross-sectional view for explaining the semiconductor device and the method of manufacturing the same of the first embodiment of the invention.

Then, as shown in FIG. 9, the front surface side of the first substrate 1 and a supporting body 16 (a second supporting body) are attached to each other with an adhesive layer 15 made of epoxy resin, polyimide (e.g. photosensitive polyimide), a resist, acrylic, or the like being interposed therebetween. The thickness of the adhesive layer 15 is about several μm to several ten μm. The adhesive layer 15 is transparent and has a property of transmitting light. The supporting body 16 is made of a transparent or semitransparent material (e.g. glass, quartz or the like), and has a property of transmitting light. The supporting body 16 has a function of supporting the first substrate 1 and protecting the front surfaces of the LED dies 8.

Then, the back surface of the first substrate 1 is ground using a back surface grinder to thin the first substrate 1 to a predetermined thickness. The grinding process may be replaced by an etching treatment, or the combination of the grinder and the etching treatment. There is also a case where the grinding process is not necessary depending on application or specification of an end-product and the initial thickness of the provided first substrate 1. Since the ground surface by the grinding process may become rough, for example, a wet etching treatment may be performed after the grinding process, as a process for obtaining a smooth surface.

Figure 10:
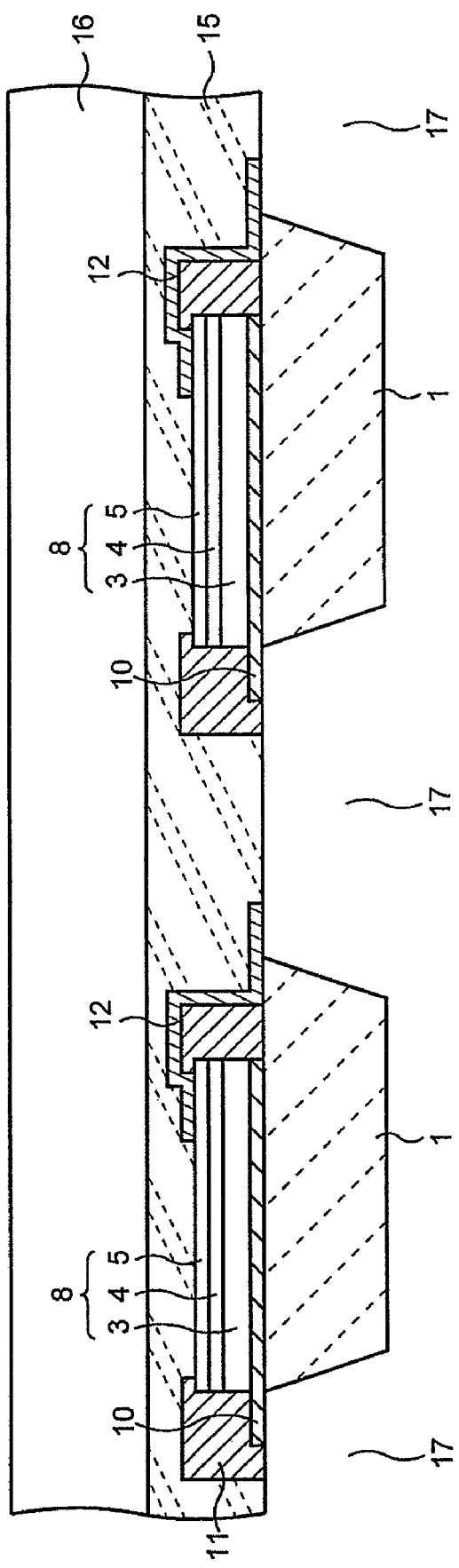
FIG. 10 is a cross-sectional view for explaining the semiconductor device and the method of manufacturing the same of the first embodiment of the invention.

Then, as shown in FIG. 10, a predetermined region of the first substrate 1 corresponding to the anode electrodes 12 and the cathode electrodes 10 is selectively etched from the back surface side to partially expose the anode electrodes 12 and the cathode electrodes 10. Hereafter, this exposing portion is referred to as an opening 17. Although the sidewalls of the first substrates 1 are etched obliquely in the embodiment, these may be etched perpendicularly relative to the main surface of the supporting body 16 instead. The etching portion may be appropriately changed as long as the anode electrodes 12 and the cathode electrodes 10 are partially exposed.

Figure 11:
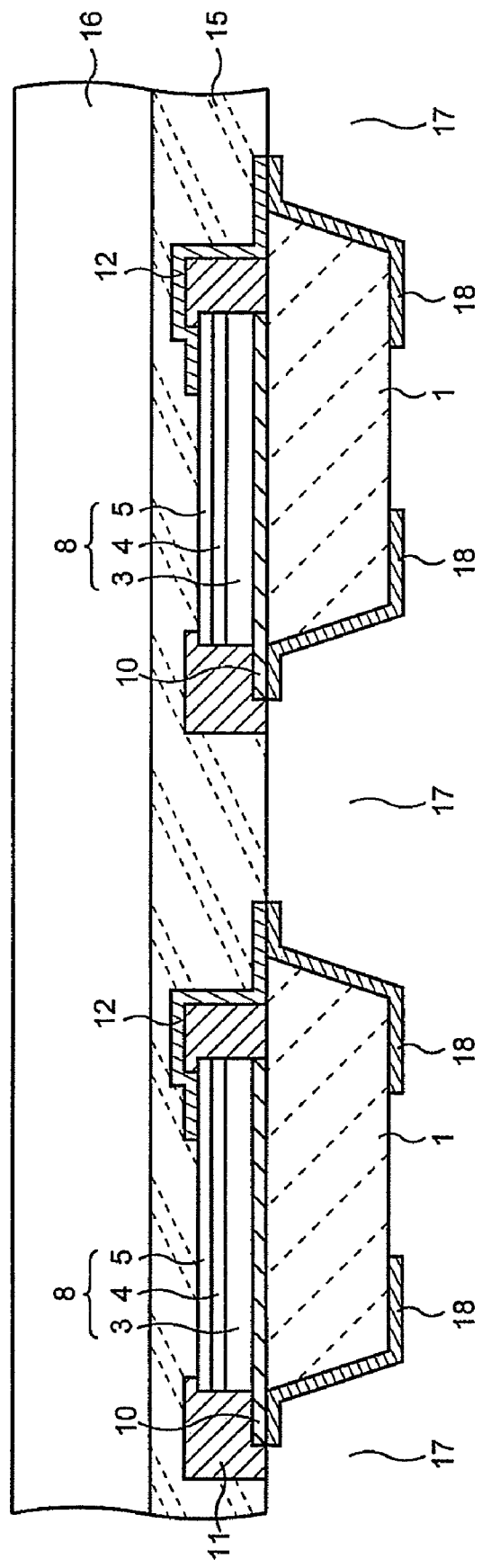
FIG. 11 is a cross-sectional view for explaining the semiconductor device and the method of manufacturing the same of the first embodiment of the invention.

Then, a conductive layer made of aluminum, copper or the like is formed in the opening 17 and on the back surfaces of the first substrates 1 by a deposition method such as a sputtering method or the like so as to have a thickness of, for example, 1 μm. Then, the conductive layer is selectively etched using a resist layer (not shown) as a mask. By this etching, the conductive layer becomes wiring layers 18 formed along the side surfaces of the first substrates 1 as shown in FIG. 11. As shown in FIG. 11, the wiring layers 18 are connected to parts of the anode electrodes 12 and parts of the cathode electrodes 10, respectively, and extend onto the back surfaces of the first substrates 1.

Figure 12:
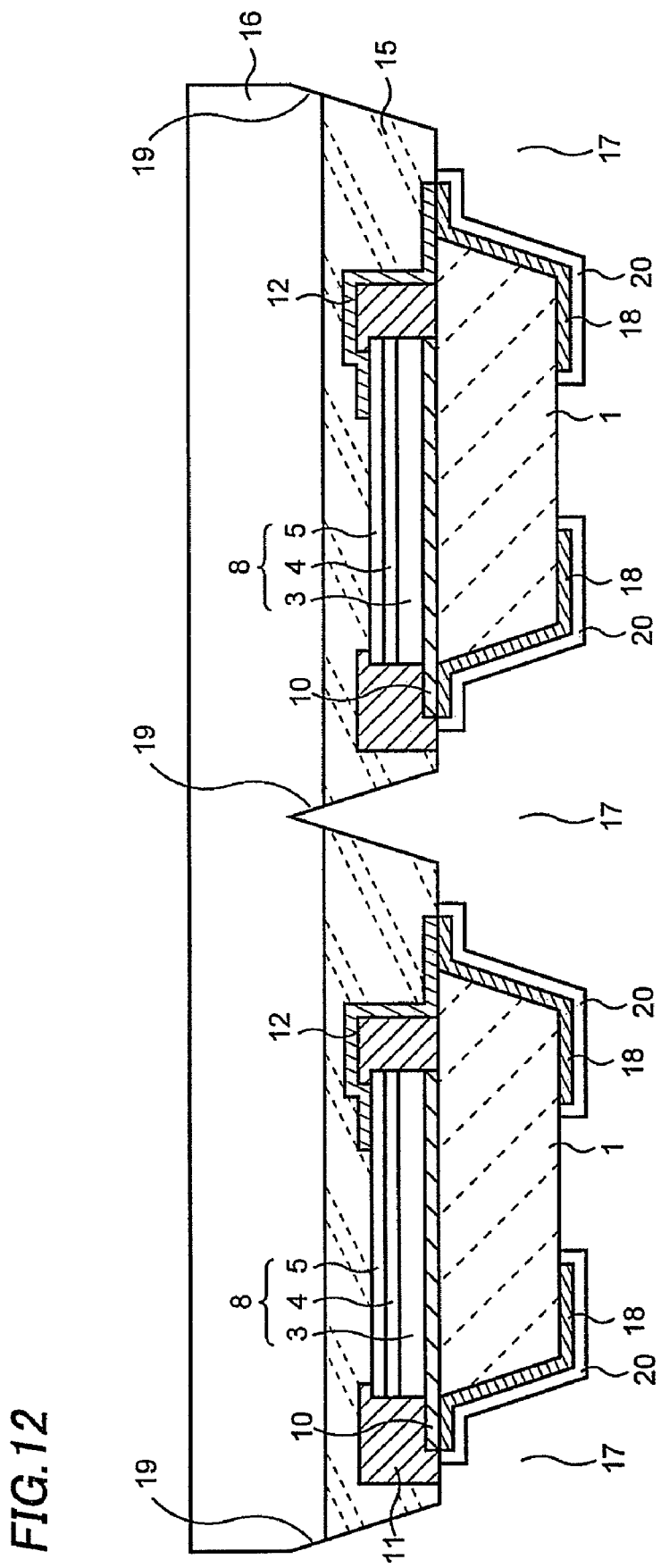
FIG. 12 is a cross-sectional view for explaining the semiconductor device and the method of manufacturing the same of the first embodiment of the invention.

Then, as shown in FIG. 12, it is preferable to remove parts of the adhesive layer 15 and parts of the supporting body 16 from the first substrate 1 side using a dicing blade or by etching, thereby forming notch portions 19. The cross-sectional shape of the notch portion 19 is not limited to the V shape as long as the notch portion 19 reaches the supporting body 16, and may be an oval shape, an almost rectangular shape or the like.

Then, electrode connection layers 20 covering the wiring layers 18 are formed. The electrode connection layers 20 are formed because the wiring layers 18 made of aluminum or the like and the conductive terminals 22 made of solder or the like that will be described below are rather difficult to be attached together and for the purpose of preventing the material of the conductive terminals 22 from entering the wiring layers 18 side. The electrode connection layers 20 may be formed by, for example, a lift-off method in which metal layers such as a nickel (Ni) layer and a gold (Au) layer are sequentially sputtered using a resist layer as a mask and then the resist layer is removed, or a plating method.

Figure 13:
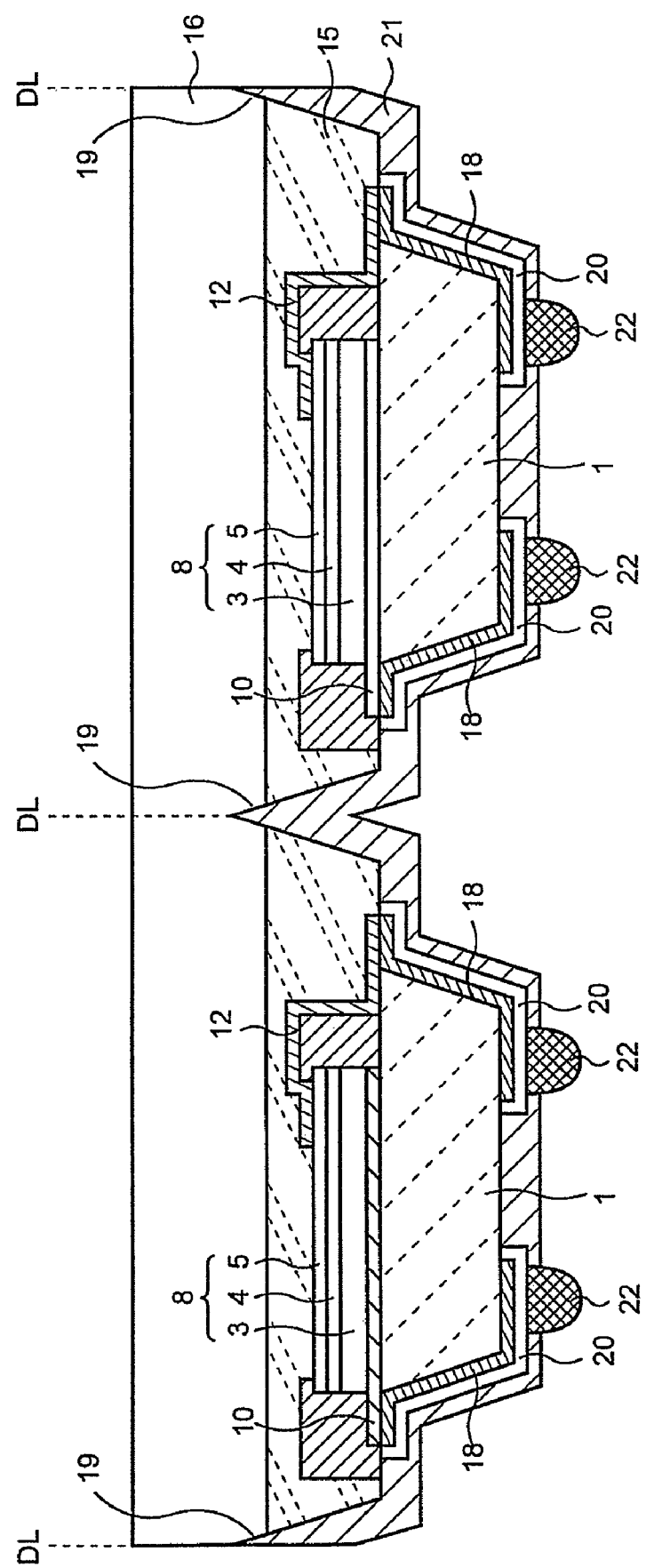
FIG. 13 is a cross-sectional view for explaining the semiconductor device and the method of manufacturing the same of the first embodiment of the invention.
Figure 14:
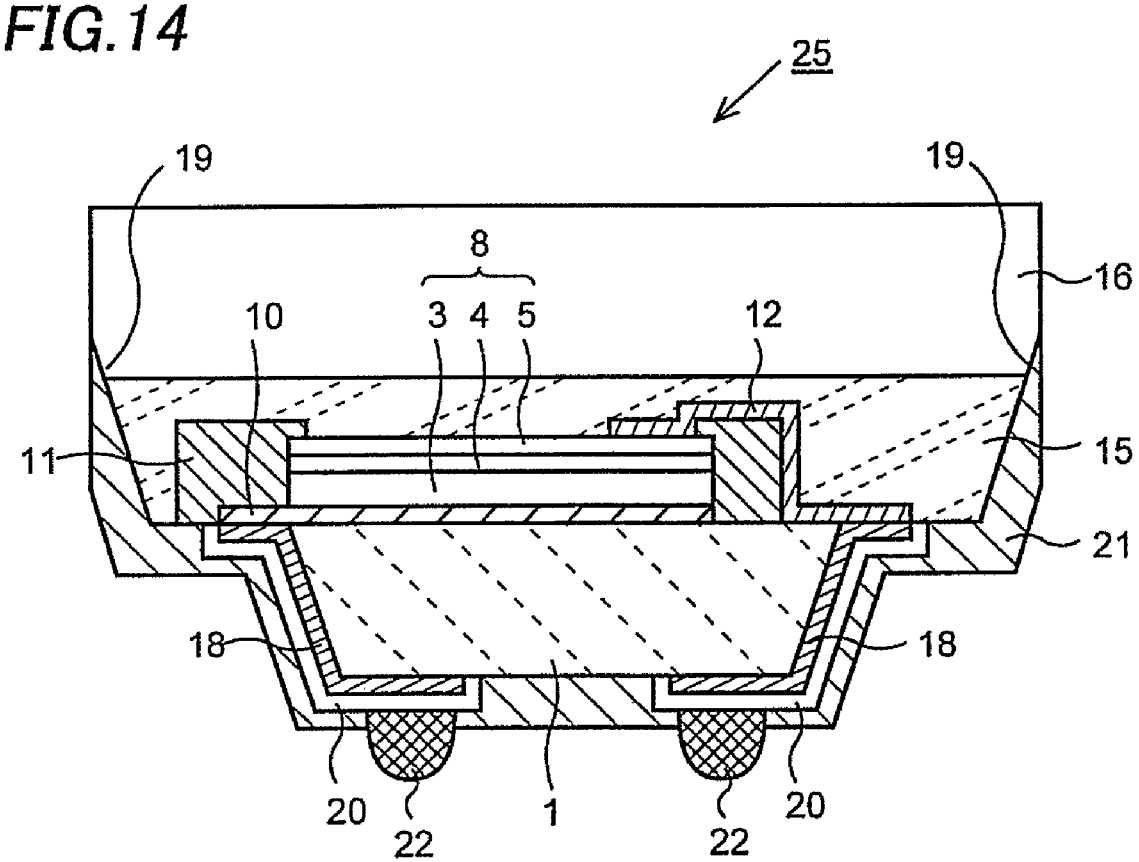
FIG. 14 is a cross-sectional view for explaining the semiconductor device and the method of manufacturing the same of the first embodiment of the invention.

Then, as shown in FIG. 13, a protection layer 21 having openings in regions for forming the conductive terminals 22 that will be described below is formed to have a thickness of, for example, 10 μm. The protection layer 21 is formed in the following manner, for example. First, an organic type material such as polyimide type resin, solder resist or the like is applied to the whole surface by an applying and coating method, and then a heat treatment (pre-baking) is performed thereto. Exposure and development are then performed to the applied organic type material to form openings exposing the predetermined regions, and then a heat treatment (post-baking) is performed thereto. The protection layer 21 having the openings in the regions for forming the conductive terminals 22 is thus obtained. Since the notch portions 19 are formed in the embodiment, the side surfaces of the supporting body 16 are partially covered by the protection layer 21. It means that the side surfaces of the adhesive layer 15 are completely covered by the protection layer 21. This prevents the adhesive layer 15 from being exposed to the air, and prevents a corrosive substance (e.g. moisture) from entering the LED die 8 and the adhesive layer 15.

Then, a conductive material (e.g. solder) is screen-printed on the electrode connection layers 20 exposed from the openings of the protection layer 21, and this conductive material is reflowed by a heat treatment. As shown in FIG. 13, the conductive terminals 22 electrically connected to the anode electrodes 12 and the cathode electrodes 10 through the wiring layers 18 are thus formed on the back surfaces of the first substrates 1. The method of forming the conductive terminals 22 is not limited to above, and the conductive terminals 22 may be formed by an electrolytic plating method, a so-called dispensing method (an applying method) in which solder or the like is applied to predetermined regions using a dispenser, or the like. The conductive terminals 22 may be made of gold, copper or nickel, and the material is not limited particularly. The electrode connection layers 20 may be formed after the formation of the protection layer 21.

Then, these are cut off along predetermined dicing lines DL and separated into individual dies. There are a dicing method, an etching method, a laser cutting method and so on, as a method of separating these into individual dies.

By the processes described above, as shown in FIG. 14, semiconductor devices 25 of a chip size package type are completed, each of which has the light emitting element (the LED die 8) formed between the attached surfaces of the first substrate 1 and the supporting body 16. The semiconductor device 25 is mounted on a printed board or the like through the conductive terminals 22.

Figure 25:
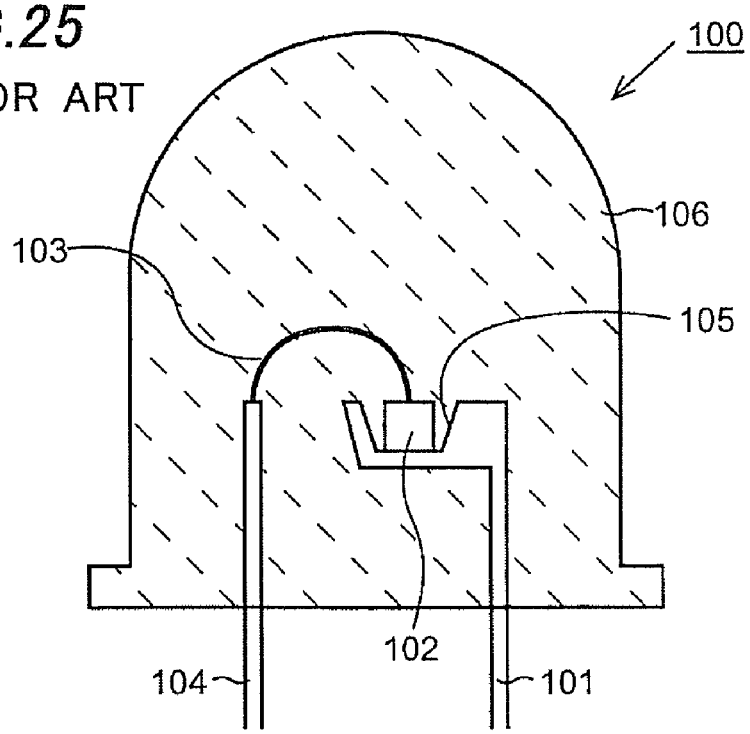
FIG. 25 is a cross-sectional view for explaining a conventional semiconductor device.

Unlike the conventional structure (refer to FIG. 25) in which the components (the LED die, the lead, the bonding wire) are separately formed, the structure of the embodiment has united dies before the cutting into the individual semiconductor devices, i.e., from in the wafer state. Furthermore, since the components of the semiconductor device are formed by a wafer process (a Wafer Process), the formation of finer components is achieved. This realizes a thinner and smaller semiconductor device. The wafer process is a process in which various components are formed on a wafer-shaped substrate before separated into individual semiconductor devices.

Furthermore, although conventionally a plurality of components is manufactured separately and devices are then completed by assembling these, in the embodiment the semiconductor device is completed as a die at the time of separation into individual semiconductor devices. This omits an assembling work (a process of disposing a LED die on a lead, a process of connecting a LED die and a lead using a bonding wire, a process of sealing the whole with transparent resin, and so on, that are conventionally included), and also enhances the workability and productivity of a semiconductor device having a light emitting element.

Next, a second embodiment of the invention will be described referring to figures. FIGS. 15 to 21 are cross-sectional views in manufacturing process order. The description of the same components and manufacturing processes as those of the first embodiment is omitted or simplified.

Figure 15:
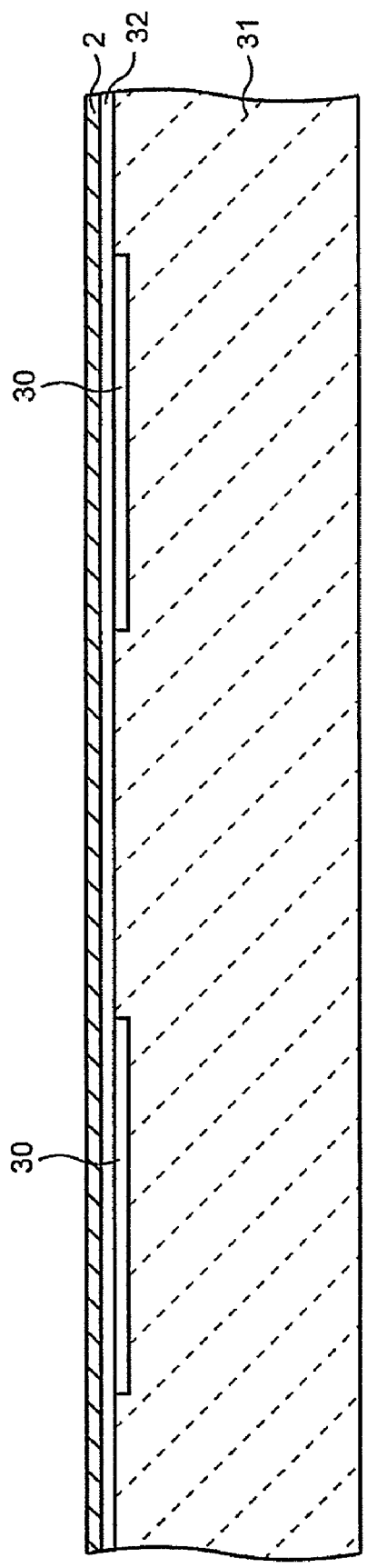
FIG. 15 is a cross-sectional view for explaining a semiconductor device and a method of manufacturing the same of a second embodiment of the invention.

First, as shown in FIG. 15, a semiconductor substrate 31 made of, for example, silicon (Si) or the like having device elements 30 formed on the front surface is provided. There is no limitation in the type and function of the device element 30, and for example, the device element 30 preferably includes a driver element that controls the lighting on and off of the LED die 8. The thickness of the semiconductor substrate 31 is about 300 to 700 μm, for example.

Then, a first insulation film 32 (e.g. a silicon oxide film formed by a thermal oxidation method, a CVD method or the like) is formed on the front surface of the semiconductor substrate 31 so as to have a thickness of, for example, 2 μm. The conductive layer 2 is then formed by a deposition method such as a sputtering method or the like so as to have a thickness of, for example, 1 μm.

Figure 16:
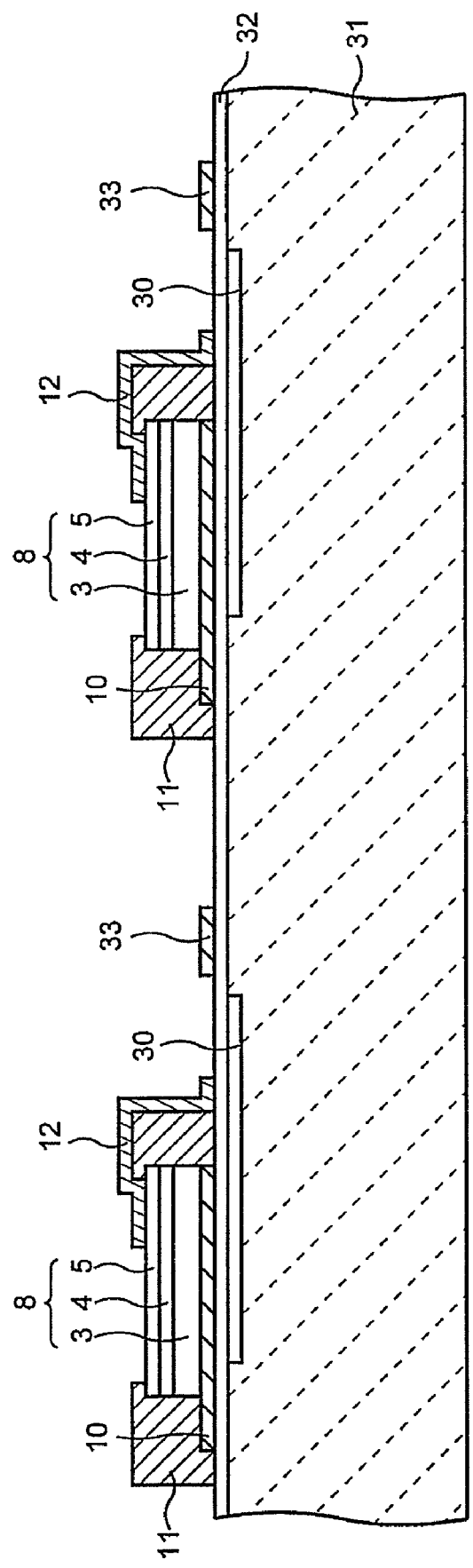
FIG. 16 is a cross-sectional view for explaining the semiconductor device and the method of manufacturing the same of the second embodiment of the invention.

Then, as described using FIG. 6, the plurality of LED dies 8 is transferred to the front surface of the semiconductor substrate 31. Then, an unnecessary portion of the conductive layer 2 is selectively etched using a resist layer (not shown) as a mask. The conductive layer 2 thus forms pad electrodes 33 and the cathode electrodes 10 of the LED dies 8 as shown in FIG. 16. The pad electrodes 33 are electrodes electrically connected to the device elements 30 or peripheral elements of these through wirings (not shown), respectively.

Although the conductive layer 2 is patterned into the pad electrodes 33 and the cathode electrodes 10 after the LED dies 8 are transferred to the semiconductor substrate 31 in the second embodiment, the conductive layer 2 may be patterned before the LED dies 8 are transferred thereto instead. According to needs, a passivation film (not shown) (e.g. a silicon nitride film formed by a CVD method) covering the pad electrodes 33 partially or completely may be formed on the front surface of the semiconductor substrate 31.

Then, the insulation layers 11 covering the side surfaces of the LED dies 8 and parts of the cathode electrodes 10 are formed. The anode electrodes 12 are then formed so as to extend from on the front surface of the first substrate 1 onto the front surfaces of the P type semiconductor layers 5 along the circumferences of the insulation layers 11.

Figure 17:
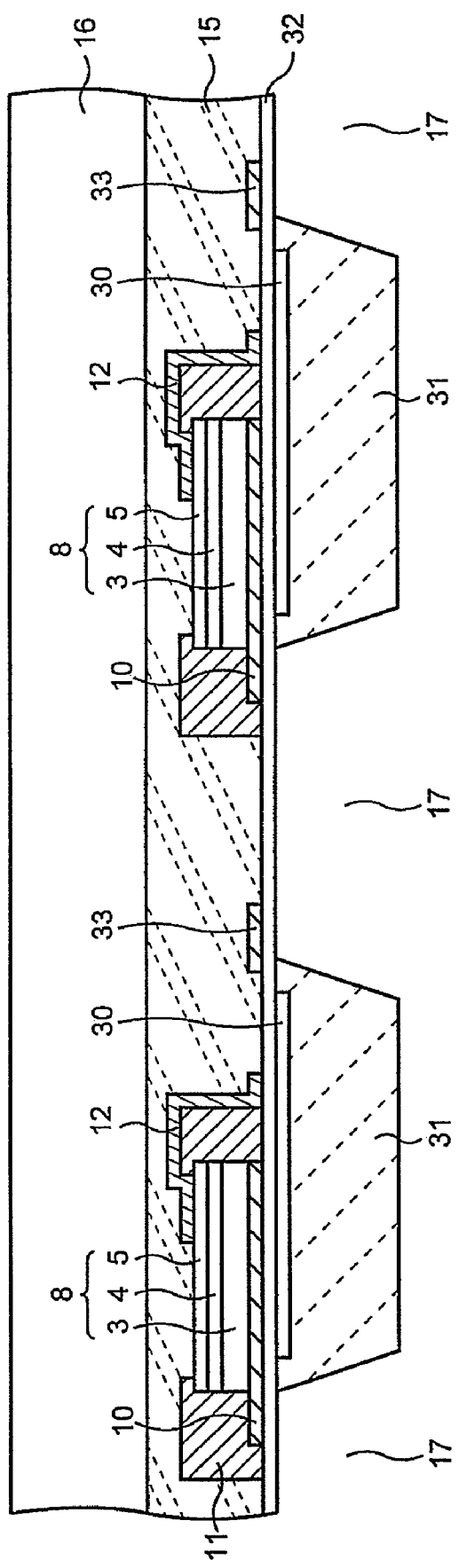
FIG. 17 is a cross-sectional view for explaining the semiconductor device and the method of manufacturing the same of the second embodiment of the invention.

Then, as shown in FIG. 17, the semiconductor substrate 31 and the supporting body 16 are attached with the adhesive layer 15 being interposed therebetween. The back surface of the semiconductor substrate 31 is then ground to have a predetermined thickness. The predetermined region of the semiconductor substrate 31 corresponding to the anode electrodes 12, the cathode electrodes 10 and the pad electrodes 33 are selectively etched from the back surface side to partially expose the anode electrodes 12, the cathode electrodes 10 and the pad electrodes 33. Hereafter, this exposing portion is referred to as the opening 17. It is noted that the anode electrodes 12 are exposed in other cross-sectional view in the similar manner described in FIG. 10.

Figure 18:
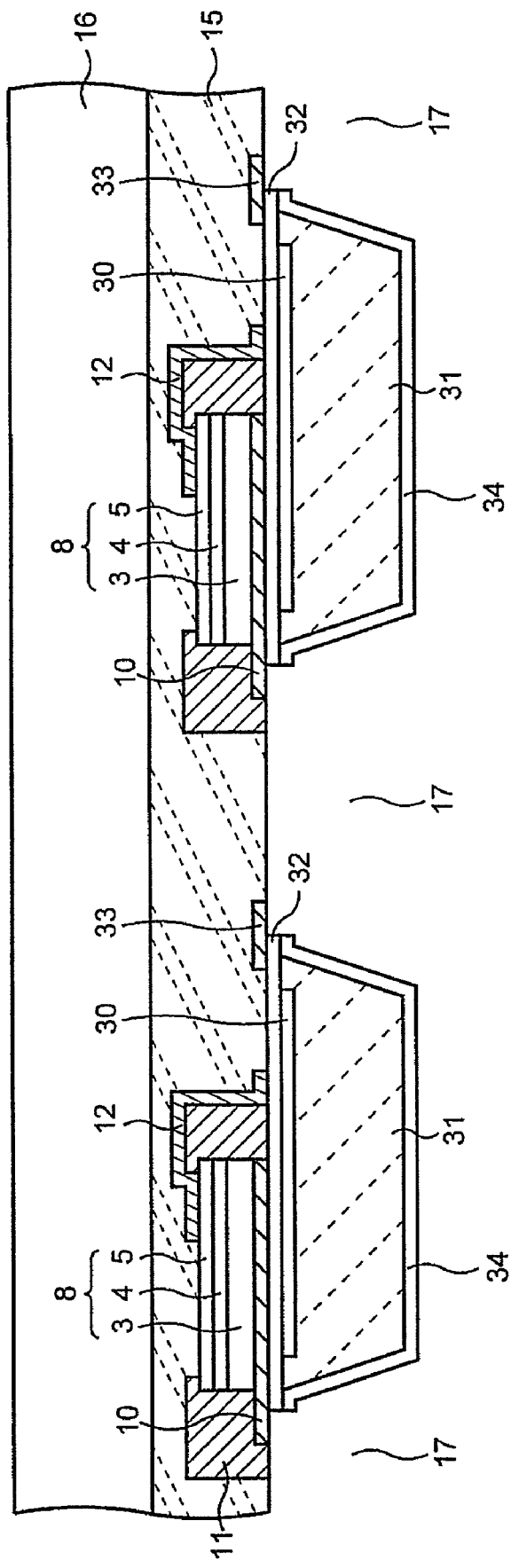
FIG. 18 is a cross-sectional view for explaining the semiconductor device and the method of manufacturing the same of the second embodiment of the invention.

Then, a second insulation film 34 is formed in the opening 17 and on the back surfaces of the semiconductor substrates 31. This second insulation film 34 is an insulation film such as a silicon oxide film, a silicon nitride film, or the like formed by, for example, a plasma CVD method. Then, as shown in FIG. 18, the first and second insulation films 32, 34 are selectively etched using a resist layer (not shown) as a mask. By this etching, the first and second insulation films 32, 34 in a region from the anode electrodes 12, the cathode electrodes 10 and the pad electrodes 33 to the boundaries of the dies (so-called dicing lines DL) are removed, and the anode electrodes 12, the cathode electrodes 10 and the pad electrodes 33 are exposed at the bottom of the opening 17.

Figure 19:
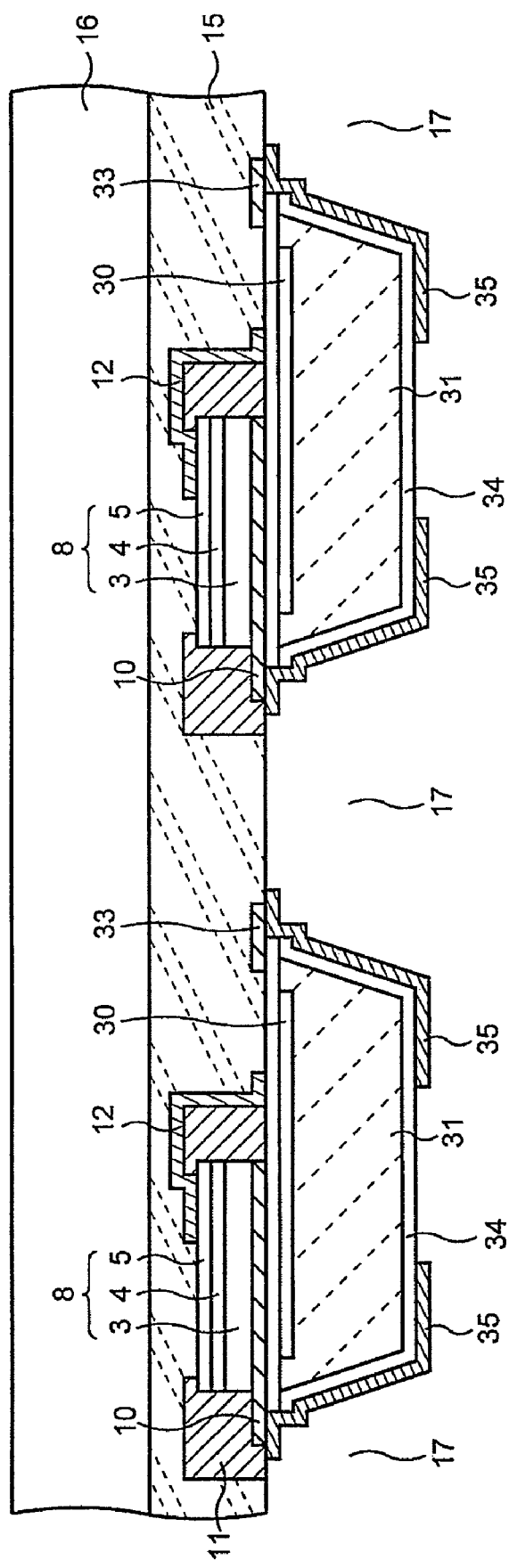
FIG. 19 is a cross-sectional view for explaining the semiconductor device and the method of manufacturing the same of the second embodiment of the invention.

Then, as shown in FIG. 19, wiring layers 35 connected to the anode electrodes 12, the cathode electrodes 10 and the pad electrodes 33 partially are formed by a deposition method such as a sputtering method or the like.

Figure 20:
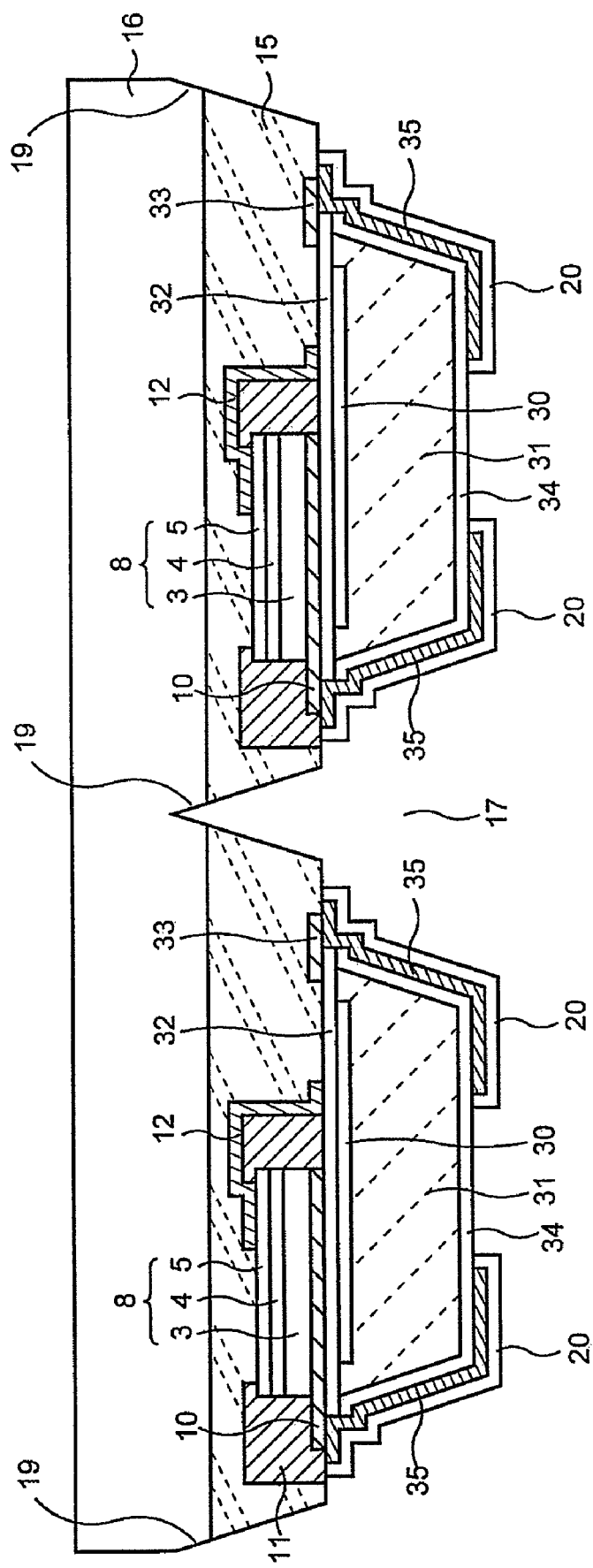
FIG. 20 is a cross-sectional view for explaining the semiconductor device and the method of manufacturing the same of the second embodiment of the invention.
Figure 21:
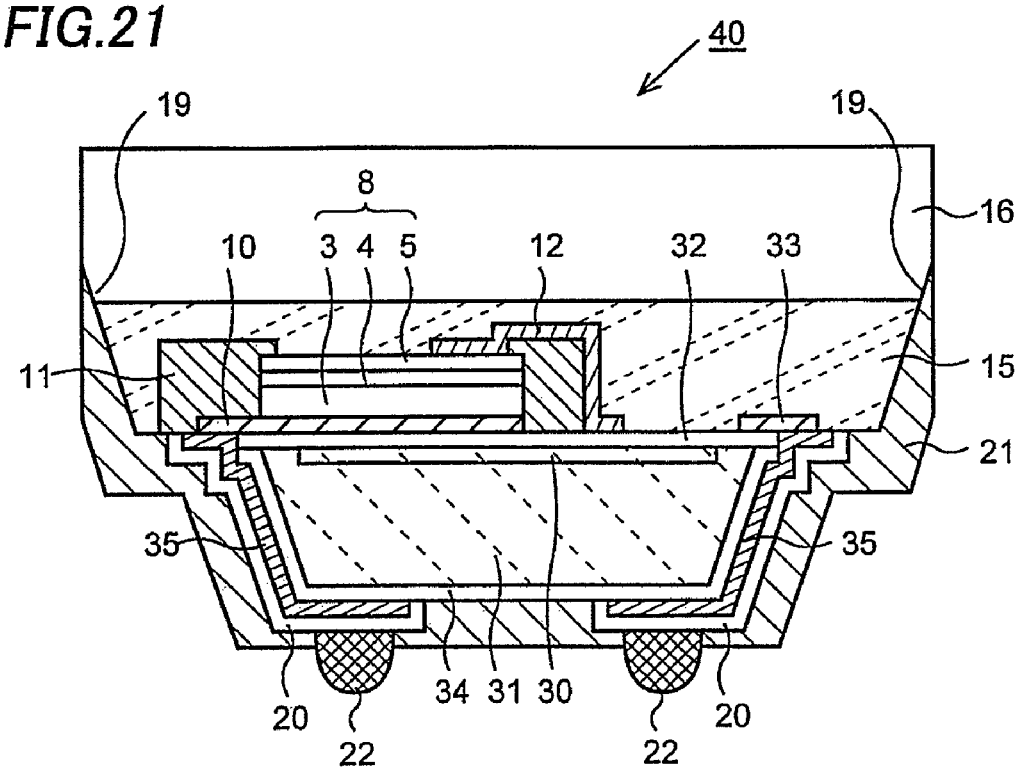
FIG. 21 is a cross-sectional view for explaining the semiconductor device and the method of manufacturing the same of the second embodiment of the invention.

Then, as shown in FIG. 20, the notch portions 19, and the electrode connection layers 20 covering the wiring layers 35 are formed. Then, as shown in FIG. 21, the protection layer 21 having openings in the regions for forming the conductive terminals 22 is formed. Then, the conductives 22 are formed on the electrode connection layers 20 exposed from the openings of the protection layer 21. Then, these are cut off along the predetermined dicing lines DL.

By the processes described above, semiconductor devices 40 of a chip size package type are completed, each of which has both of the light emitting element (the LED die 8) and the device element 30 between the attached surfaces of the semiconductor substrate 31 and the supporting body 16.

The feature of the semiconductor device 40 of the second embodiment is that the device element 30 is formed on the substrate (the semiconductor substrate 31) in addition to the light emitting element (the LED die 8). This provides a multi-functional semiconductor device having a light emitting element, which is given the effect of the first embodiment and has multiple elements effectively formed together in a die. For example, by providing the device element 30 with a driver element that controls the lighting on and off of the LED die 8, both of light emitting and control functions are realized in a die. Therefore, different from the conventional device (FIG. 25), there is no need to provide other driver device than the semiconductor device. In this case, the device element 30 and the LED die 8 are electrically connected using the wiring layer 35 or a wiring of a mounting board side.

Figure 22:
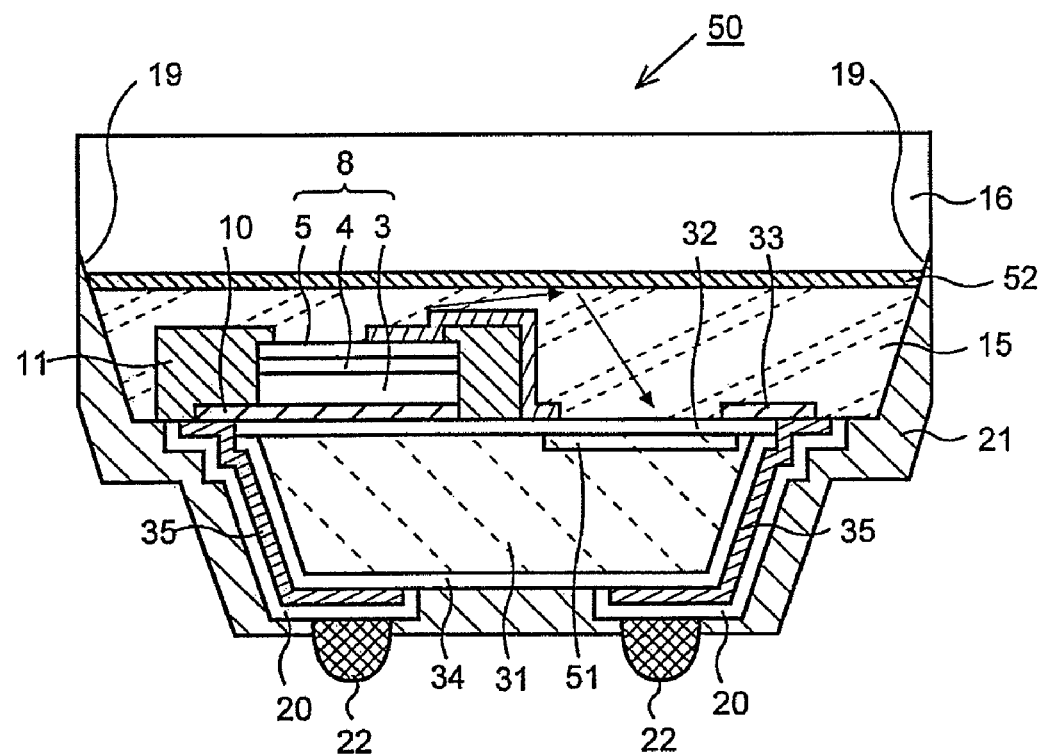
FIG. 22 is a cross-sectional view for explaining a semiconductor device and a method of manufacturing the same of a third embodiment of the invention.

Next, a third embodiment of the invention will be described. FIG. 22 is a cross-sectional view of a semiconductor device 50 of the third embodiment. The description of the same components and manufacturing processes as those of the first and second embodiments described above is omitted or simplified.

In the semiconductor device 50 of the third embodiment, as shown in FIG. 22, a light receiving element 51 is formed on the semiconductor substrate 31. The light receiving element 51 includes a photodiode (Photo Diode), a phototransistor (Photo Transistor) or the like that are generally known, and has a function of converting light into an electric signal. A metal layer 52 that reflects light emitted from the LED die 8 to the light receiving element 51 side is formed between the supporting body 16 and the adhesive layer 15. The metal layer 52 is preferably made of a material with high reflectance such as aluminum (Al) or the like, and may be formed on the attachment surface of the supporting body 16 by, for example, a sputtering method before the attachment of the supporting body 16.

The feature of the semiconductor device 50 of the third embodiment is that the light receiving element 51 is formed on the substrate (the semiconductor substrate 31) in addition to the light emitting element (the LED die 8) and the metal layer 52 is formed. Therefore, the semiconductor device 50 is given the effect of the second embodiment and is used as a photocoupler.

Figure 26:
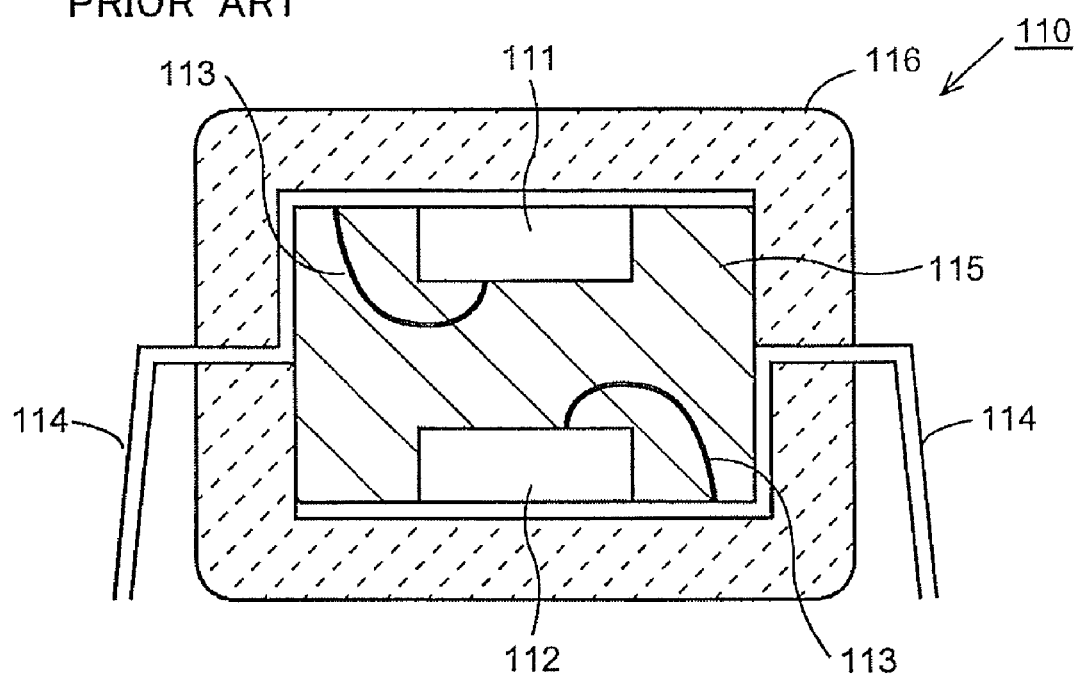
FIG. 26 is a cross-sectional view for explaining a conventional semiconductor device.

Although the conventional photocoupler (FIG. 26) is manufactured by completing two dies (a LED die and a PD die) separately and uniting these through a subsequent assembling work, in the embodiment the structure has united dies from in the wafer state. Furthermore, the components of the photocoupler are formed by a wafer process. This realizes a thinner and smaller photocoupler. Furthermore, since a conventional assembling work (a process of disposing a light emitting element and a light receiving element on leads so that these face each other, a process of connecting dies and leads using bonding wires respectively, a process of filling a space between dies with transparent resin, and so on) is omitted, the workability and productivity of a photocoupler are enhanced.

Figure 23:
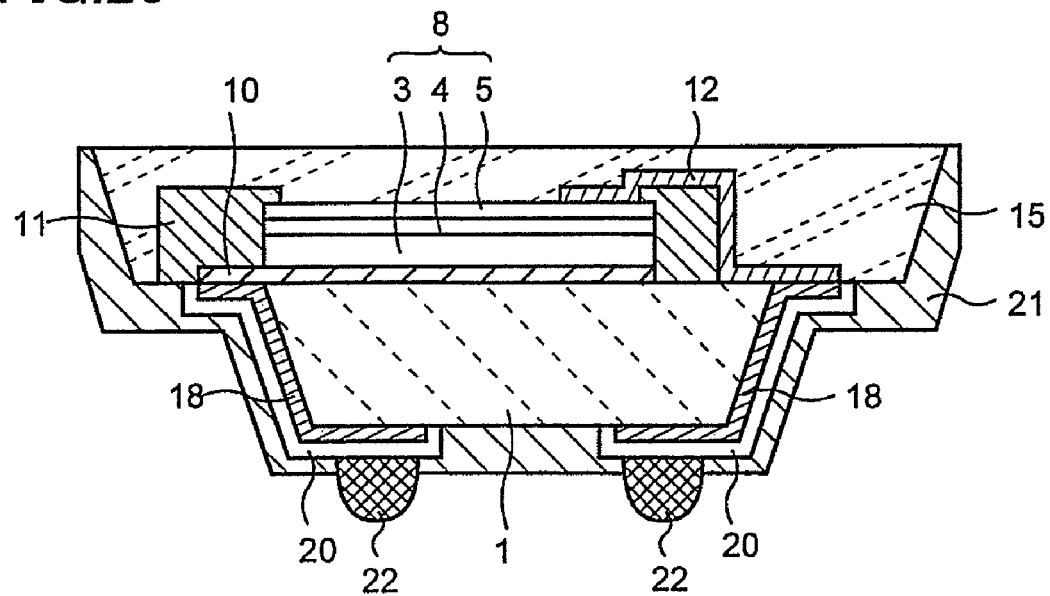
FIG. 23 is a cross-sectional view for explaining a semiconductor device of a modification of the invention.

The invention is not limited to the embodiments described above, and a modification is possible within the scope of the invention. For example, as shown in FIG. 23, the supporting body 16 may be removed from the first substrate 1 or the semiconductor substrate 31 before or after the dicing process.

Figure 24:
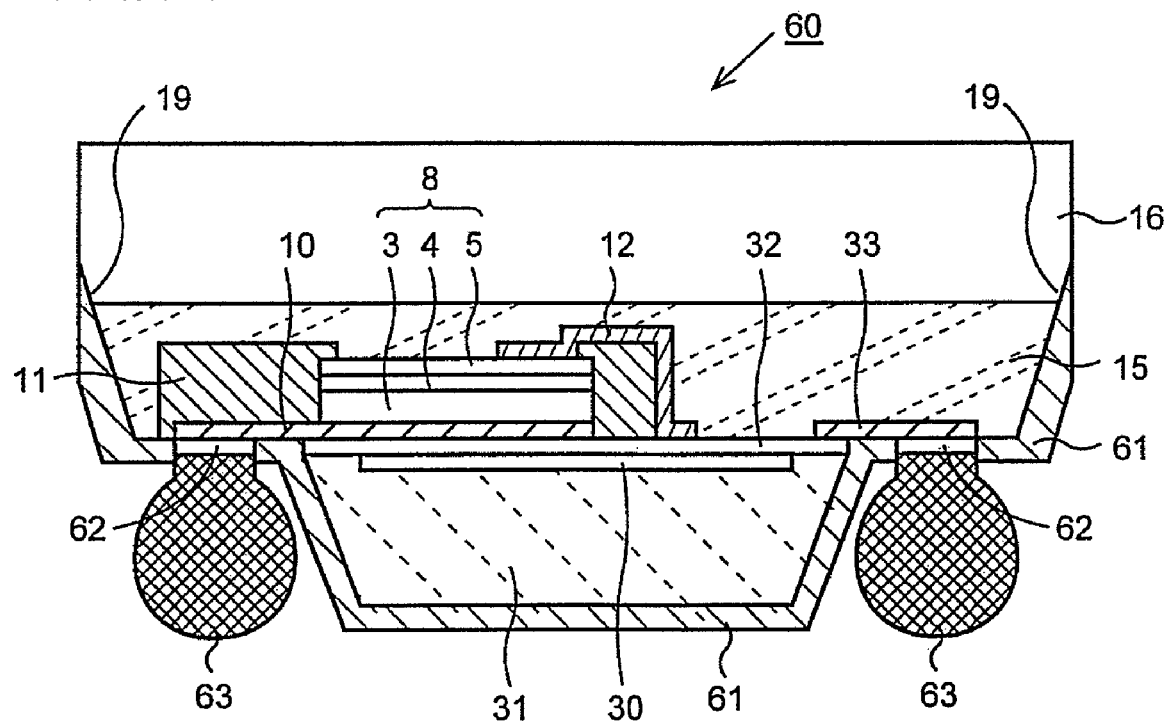
FIG. 24 is a cross-sectional view for explaining a semiconductor device of a modification of the invention.

Furthermore, a semiconductor device as shown in FIG. 24 may be manufactured. The same numerals are given to the same components as those described above, and the description is omitted.

A semiconductor device 60 shown in FIG. 24 is formed with a protection layer 61 having openings in positions corresponding to the cathode electrode 10, the anode electrode 12 and the pad electrode 33 and covering the side and back surfaces of the semiconductor substrate 31. Then, electrode connection layers 62 are formed on the cathode electrode 10, the anode electrode 12 and the pad electrode 33 in the positions of the openings of the protection layer 61. The electrode connection layers 62 are the same layers as the electrode connection layers 20, which are layers formed by layering a nickel (Ni) layer and a gold (Au) layer sequentially, for example. Conductive terminals 63 made of solder or the like are formed on the cathode electrode 10, the anode electrode 12 and the pad electrode 33 with the electrode connection layers 62 being interposed therebetween. The anode electrode 12 is electrically connected to the conductive terminal 63 in other cross-sectional view. In this manner, the conductive terminals 63 may be formed near the sidewall of the semiconductor substrate 31, instead of the formation of the second insulation film 34 and the wiring layers 35 on the side and back surfaces of the semiconductor substrate 31 as shown in the second embodiment.

With this structure, since the process of forming the second insulation films 34 and the wiring layers 35 is omitted, the manufacturing process is simplified and the manufacturing cost is minimized. Furthermore, the conductive terminals 63 are not formed on the back surface of the semiconductor substrate 31 but formed near the sidewall of the semiconductor substrate 31, the semiconductor device becomes thinner. Furthermore, the etching portion of the semiconductor substrate 31 when the opening 17 is formed may be appropriately changed. Therefore, it is possible to form the conductive terminals 63 so as not to be exposed from the side surface of the semiconductor device. Although a modification of the second embodiment is described in FIG. 24, the similar conductive terminals may be formed in the first and third embodiments.

Furthermore, in the embodiment described above, the conductive terminals and the wiring layers are formed on one substrate (the substrate on the side where the light emitting element is formed), and the conductive terminals and the wiring layers are not formed on the other substrate (the supporting body 16). However, the invention is not limited to this. Therefore, according to needs, predetermined openings may be formed in the substrate on which the light emitting element is not formed, and then the wiring layers and the conductive terminals may be formed in the openings. In this manner, the way of supplying a voltage to the light emitting element and the device element may be appropriately changed.

Although a BGA type semiconductor device having ball-shaped conductive terminals (22, 63) is described in the embodiments described above, the invention may be applied to an LGA (Land Grid Array) type semiconductor device. The invention is widely applicable as a technology of compactly sealing a semiconductor device having a light emitting element.

What is claimed is:

1. A semiconductor device comprising:
a substrate made of a semiconductor and having a front surface and a back surface;
a light emitting element comprising a first conductive region and a second conductive region and disposed on the front surface of the substrate so that the first conductive region faces the front surface;
an insulation layer covering a side surface of the light emitting element;
a first electrode formed on the front surface of the substrate and electrically connected to the first conductive region;
a second electrode formed on the front surface of the substrate and extending along the insulation layer so as to be electrically connected to the second conductive region, the second electrode being physically in contact with the insulation layer; and
a wiring layer electrically connected to the first or second electrode and extending along a side surface of the substrate,
wherein the first electrode is disposed between the first conductive region and the front surface of the substrate.

2. A semiconductor device comprising:
a substrate made of a semiconductor and having a front surface and a back surface;
a light emitting element comprising a first conductive region and a second conductive region and disposed on the front surface of the substrate so that the first conductive region faces the front surface;
an insulation layer covering a side surface of the light emitting element;
a first electrode formed on the front surface of the substrate and electrically connected to the first conductive region;
a second electrode formed on the front surface of the substrate and extending along the insulation layer so as to be electrically connected to the second conductive region, the second electrode being physically in contact with the insulation layer; and
a conductive terminal electrically connected to the first or second electrode and protruding in a thickness direction of the substrate,
wherein the first electrode is disposed between the first conductive region and the front surface of the substrate.

3. The semiconductor device of claim 2, further comprising another device element formed on the front surface of the substrate.

4. The semiconductor device of claim 2, wherein the conductive terminal is disposed on the back surface of the substrate.

5. A semiconductor device comprising:
a substrate having a front surface and a back surface;
a light emitting element comprising a first conductive region and a second conductive region and disposed on the front surface of the substrate so that the first conductive region faces the front surface;
an insulation layer covering a side surface of the light emitting element;
a first electrode formed on the front surface of the substrate and electrically connected to the first conductive region;
a second electrode formed on the front surface of the substrate and extending along the insulation layer so as to be electrically connected to the second conductive region;
a wiring layer electrically connected to the first or second electrode and extending along a side surface of the substrate; and
another device element formed on the front surface of the substrate,
wherein the another device element comprises an element that converts light into an electric signal, and the semiconductor device further comprises a metal layer disposed above the light emitting element so that the metal layer reflects light emitted from the light emitting element toward the another device element.

6. The semiconductor device of claim 5, further comprising a supporting body attached to the substrate with an adhesive layer interposed therebetween, the adhesive layer covering the light emitting element.

7. A semiconductor device comprising:
a substrate having a front surface and a back surface;

a light emitting element comprising a first conductive region and a second conductive region and disposed on the front surface of the substrate so that the first conductive region faces the front surface;

an insulation layer covering a side surface of the light emitting element;

a first electrode formed on the front surface of the substrate and electrically connected to the first conductive region;

a second electrode formed on the front surface of the substrate and extending along the insulation layer so as to be electrically connected to the second conductive region;

a conductive terminal electrically connected to the first or second electrode and protruding in a thickness direction of the substrate; and another device element formed on the front surface of the substrate, wherein the another device element comprises an element that converts light into an electric signal, and the semiconductor device further comprises a metal layer disposed above the light emitting element so that the metal layer reflects light emitted from the light emitting element toward the another device element.

8. The semiconductor device of claim 7, further comprising a supporting body attached to the substrate with an adhesive layer interposed therebetween, the adhesive layer covering the light emitting element.

* * * * *